United States Patent
He et al.

(10) Patent No.: US 6,919,637 B2
(45) Date of Patent: Jul. 19, 2005

(54) INTERCONNECT STRUCTURE FOR AN INTEGRATED CIRCUIT AND METHOD OF FABRICATION

(75) Inventors: Jun He, Portland, OR (US); Jose Maiz, Portland, OR (US); Hyun-Mog Park, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/261,543

(22) Filed: Sep. 30, 2002

(65) Prior Publication Data

US 2004/0061231 A1 Apr. 1, 2004

(51) Int. Cl.[7] .............................................. H01L 29/40
(52) U.S. Cl. .................. 257/758; 257/773; 257/774; 257/775; 257/776; 257/762
(58) Field of Search .......................... 257/758, 773–776, 257/762

(56) References Cited

U.S. PATENT DOCUMENTS 5,783,864 A * 7/1998 Dawson et al. ............. 257/758
2002/0145201 A1 * 10/2002 Armbrust et al. ........... 257/776

* cited by examiner

*Primary Examiner*—George Fourson
*Assistant Examiner*—Thanh V. Pham
(74) *Attorney, Agent, or Firm*—Blakely, Sokoloff, Taylor & Zafman LLP

(57) ABSTRACT

An interconnect structure for an integrated circuit having several levels of conductors is disclosed. Dielectric pillars for mechanical support are formed between conductors in adjacent layers at locations that do not have vias. The pillars are particularly useful with low-k ILD or air dielectric.

9 Claims, 4 Drawing Sheets

INTERCONNECT STRUCTURE FOR AN INTEGRATED CIRCUIT AND METHOD OF FABRICATION

FIELD OF THE INVENTION

The invention relates to the field of interconnect structures, particularly those formed above a substrate in an integrated circuit.

PRIOR ART

In current integrated circuits, a complex interconnect structure having many layers of conductors is formed above a substrate. The layers of conductors are separated by an interlayer dielectric (ILD) with vias extending from conductors in one layer to the conductors in an underlying layer. Often the conductors are fabricated using a damascene process where the conductors are, in essence, inlaid within the ILD.

With each generation of integrated circuits, more performance is sought, and hence, there is a need to reduce the capacitance between the conductors as one way to increase operating speeds. Using dielectric materials having a lower k for the ILD helps reduce capacitance. However, some of the low k materials are soft and/or porous, and do not provide good mechanical strength. The metal lines forming the conductors may sag, and consequently, fatigue or electromigration problems can occur. Additionally, if the conductors are not secure, the conductor may move under the influence of magnetic or electric fields. This can cause changes in capacitance which affects the operation of the circuit. This problem becomes even greater where air or a vacuum dielectric is used since this eliminates all mechanical support between the conductors except for the vias.

One solution to the above problem is to form extra vias. These "dummy" vias are not necessarily needed to provide electrical paths, although in some cases, they may provide redundant paths. In other cases, the vias are not current carrying in that they extend upwardly to, or be supported from, an unused and electrically floating conductor segment. Using dummy vias has limitations. Vias cannot always be used where needed for support since they may cause short circuits or other undesirable circuit paths. Consequently, a truly uniform via density cannot be maintained without undesirable circuit layout limitations.

DETAILED DESCRIPTION

An interconnect structure and methods of fabricating the structure are disclosed. In the following description numerous specific details are set forth such as specific materials and methods. It will be apparent to one skilled in the art that the present invention may be practiced without these specific details. In other instances well known processing steps have not been set forth in detail in order not to unnecessarily obscure the present invention.

Figure 1:
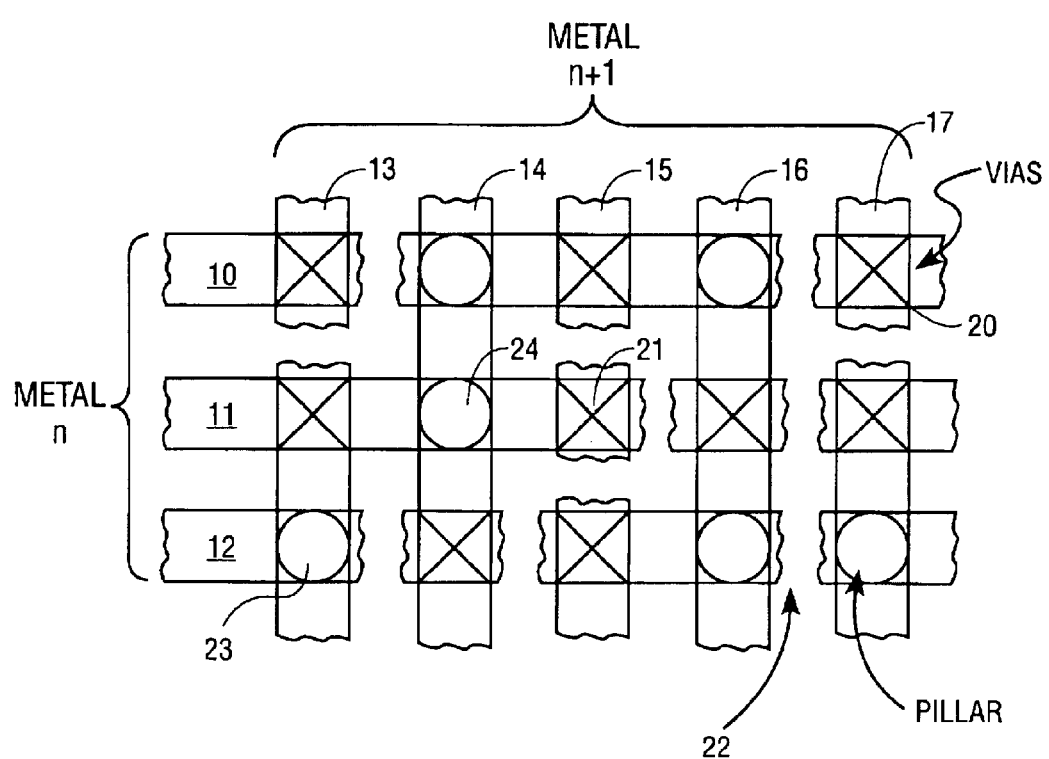
FIG. 1 is a plan view showing conductors disposed at two levels in an interconnect structure.

Referring first to FIG. 1, metal conductors at level n are shown as the spaced-apart, parallel conductor lines 10, 11, and 12. These are the conductors typically formed above the substrate and used as part of an interconnect structure. At the next level, n+1, a plurality of conductors are shown as lines 13–17. These lines are also parallel, spaced-apart lines generally perpendicular to the lines at level n.

As is typically the case, electrical connections are needed between selected lines on level n and selected lines on level n+1 to complete electrical circuits. These connections are made with vias, that is, metal contacts that extend from the conductor on one level to the conductor on the level directly below. The vias are formed at the selected intersections of the projection of the lines at level n+1 on the lines at level n. As shown in FIG. 1, by way of examples, vias are shown with a large "x" such as vias 20 and 21. In some cases some of the lines are broken as indicated by break 22. This is done to provide the desired electrical paths to complete the circuits or to isolate a line segment. In FIG. 1 conductors are shown at only two levels, n and n+1. It will be appreciated that in an integrated circuit, conductors may be used on many levels, for instance, five or six levels or more.

As taught by the present invention, where vias are not used at the intersection of the conductors in one level and those at the next level, dielectric pillars are inserted as will be described. These dielectric pillars provide support from one layer to the next and do not provide electrical paths. The pillars are distinctly and separately formed from any solid dielectric that may be present between the layers such as an ILD. This is best seen in FIG. 2.

Figure 2:
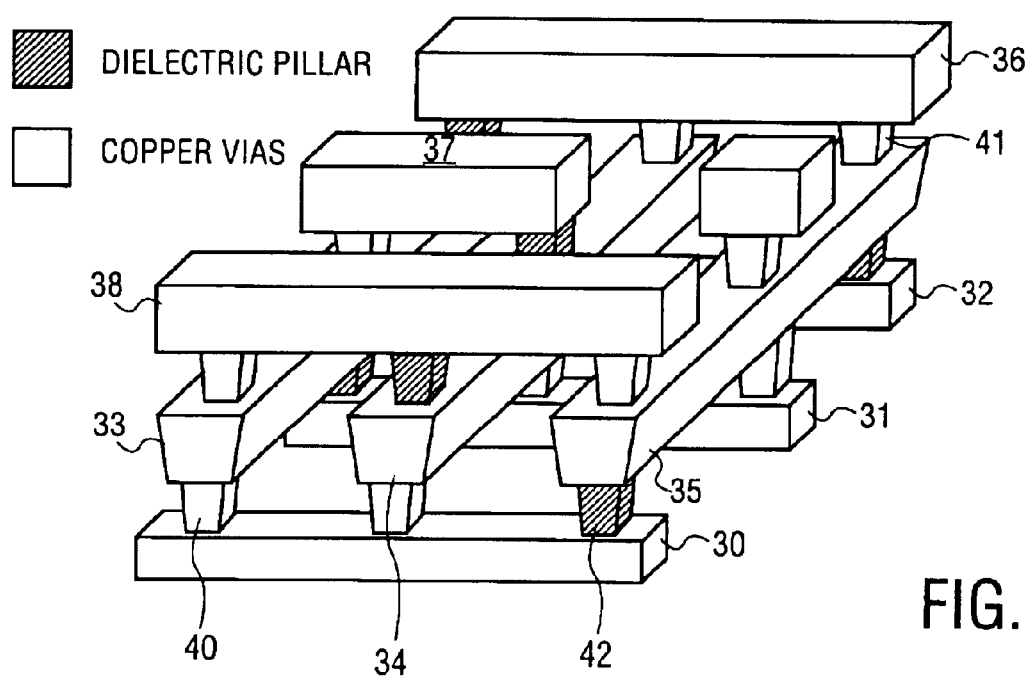
FIG. 2 is a perspective view showing three levels of conductors along with vias and dielectric pillars.

In FIG. 2, at a first level first conductor lines 30, 31 and 32 are shown. At the next level, lines 33, 34 and 35 are shown, and finally at a third level, lines 36, 37 and 38 are shown. As was the case in FIG. 1, some of the lines are broken such as line 37. Some of the lines are interconnected by vias fabricated from, for instance, copper. Via 40, for instance, provides an electrical path between lines 30 and 33. Similarly, via 41 provides an electrical path between lines 35 and 36.

Dielectric pillars are used at the intersection of the lines where vias are not needed and/or where vias cannot be used.

For instance, looking at FIG. 2, the dielectric pillar 42 provides mechanical support to line 35 from line 30. Other dielectric pillars supply support between others of the lines as illustrated.

In one embodiment, the dielectric pillars are used at every intersection where a via is not present. For instance, as shown in FIG. 1, the dielectric pillars 23 and 24 (illustrated by a circle), and the other pillars shown in FIG. 1, are used at every intersection not having a via. Similarly, in FIG. 2 a dielectric pillar is used at every intersection where a via is not used. While in FIGS. 1 and 2 numerous vias are shown, in practice in a typical integrated circuit, vias necessary to complete an electrical circuit may only be needed at, for example, 10% or less of the intersections. Thus, typically many more dielectric pillars may be used than vias.

In FIG. 2, no solid dielectric material (including a porous material) is shown disposed between the conductors either in a single layer or between layers. Here, a gas such as air or a vacuum is used as the dielectric. In other embodiments, a low-k dielectric such as a carbon doped silicon dioxide or a polymer based dielectric may be used between the conductors. These dielectrics may not provide good mechanical support, and consequently, the conductors may sag where they extend a relatively long distance between the vias but for the dielectric pillars. This, of course, is true where air or a vacuum is the dielectric. In order for the pillars to provide sufficient support, they are fabricated from a stronger material than provided by a mechanically weak low-k dielectric. For instance, the dielectric pillars may be fabricated from a chemical vapor deposited (CVD) silicon dioxide or from silicon nitride. Other non-conducting materials that provide the needed mechanical support may be used.

It is important that the conductors in the interconnect structure be mechanically secure. If for instance, a conductor moves under the influence of an electric or magnetic field, its capacitance may change, and this change can disrupt the operation of a circuit. Additionally, any movement may result in other problems such as fatigue or electromigration. By placing the pillars at all the intersections not having vias, a secure mechanical structure is formed which is particularly useful where a gas or vacuum dielectric is used or where the dielectric is mechanically weak.

In FIGS. 3–7 a first process for forming the pillars, vias and conductors in a level of the interconnect structure is shown. FIGS. 8–15 illustrate an alternate process.

Figure 3:
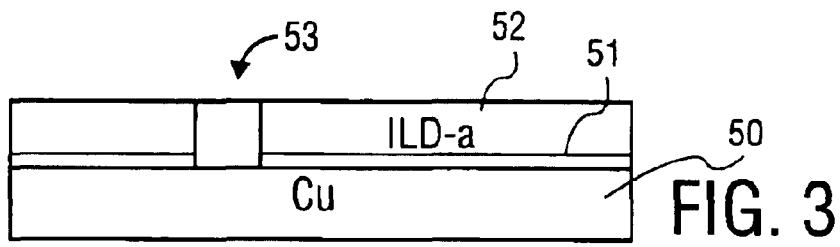
FIG. 3 is a cross-sectional elevation view showing a conductor and a interlayer dielectric (ILD).

Referring first to FIG. 3, a conductor 50 disposed at a first level in the interconnect structure is illustrated. While only a single conductor 50 is shown in FIG. 3, it will be appreciated that a plurality of such conductors are typically formed. It is assumed that the conductor 50 of FIG. 3 is formed with a damascene process and consequently, a dielectric material is present between each of the parallel, spaced-apart conductors on the same level as conductor 50.

As shown in FIG. 3, a layer 51 which will act as an etchant stop, is disposed over the conductor 50. This layer may, for instance, be a silicon dioxide layer or silicon nitride layer formed over all the conductors on the same level as conductor 50 and the dielectric material disposed between the conductors.

Then, an interlayer dielectric (ILD) 52 is deposited over the etchant stop layer 51. The layer 52, shown as "ILD-a" may be for instance a low-k dielectric such as a carbon doped oxide. The thickness of this layer corresponds to the thickness of vias which will interconnect the conductor 50 and the overlaying conductors in the next level.

As shown in FIG. 3, openings are formed in the layer 52 at locations where the dielectric pillars are to be used. An ordinary masking and etching step may be used to form the opening 53 and the corresponding openings. The layer 51 acts as an etchant stop for forming opening 53. In FIG. 3, the opening 53 is now extended through the layer 51. The opening 53 may end on the layer 52. In this case, the layer 51, remaining within the opening 53, becomes part of a dielectric pillar.

Figure 4:
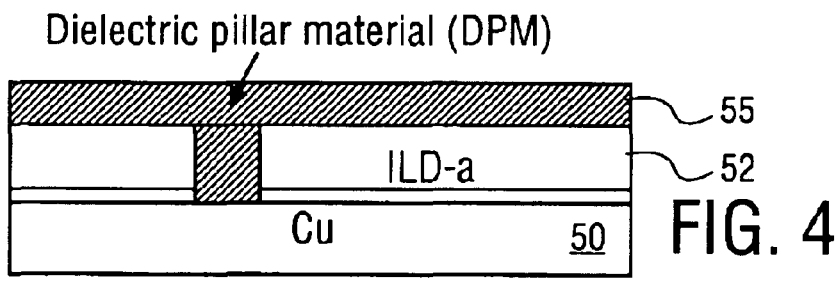
FIG. 4 illustrates the structure of FIG. 3 after the deposition of a dielectric pillar material.

Next, as shown in FIG. 4, a dielectric pillar material is deposited over the ILD-a 52. As mentioned, this material is relatively hard since it provides support between the conductors. A silicon dioxide layer or silicon nitride layer may be used.

Figure 5:
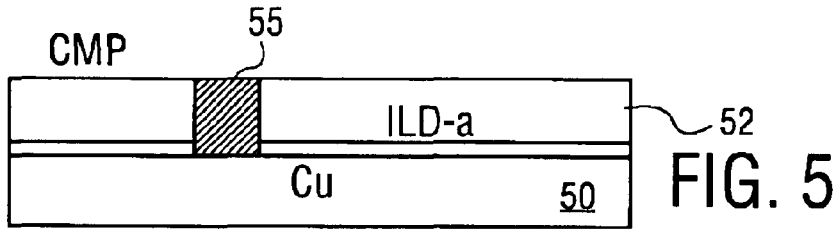
FIG. 5 illustrates the structure of FIG. 4 after a planarization step.

Following this, as shown in FIG. 5, the layer 55 is planarized, for instance, with chemical mechanical polishing (CMP) so that the dielectric pillar material is present only within the opening 53 and like openings. This exposes the ILD-a and defines the individual pillars.

Figure 6:
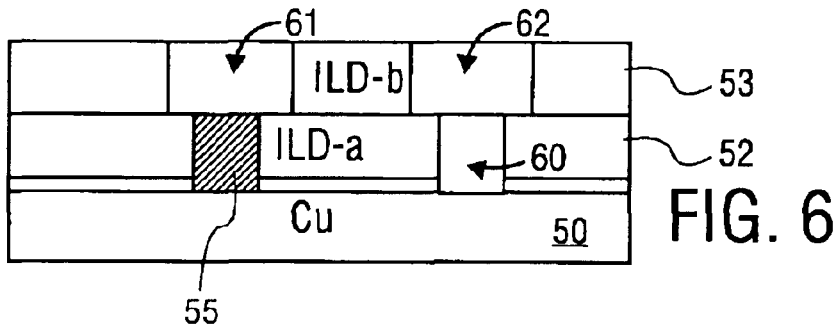
FIG. 6 illustrates the structure of FIG. 5 after the formation of a second ILD and the opening of vias and trenches.

Now, as shown in FIG. 6, a second dielectric layer 53 is formed (ILD-b). This layer has a thickness corresponding to the desired thickness of the conductors which are to be formed at the level above conductor 50. The ILD-b may be formed from the same dielectric as used for the ILD-a. Via openings are etched through both the layers 52 and 53 at those locations where vias are to be formed, using ordinary processing. Here, it is necessary to etch through the etchant stop layer 51 since the vias must be in contact with the underlying conductors.

Then, trenches are formed within the ILD-b to define the conductor openings. Two trenches, 61 and 62, are shown in FIG. 3. These trenches are generally parallel, spaced-apart trenches, perpendicular to conductor 50.

Following this, copper plugs and conductors are formed within the via openings and trenches. Ordinary processing may be used that includes a barrier material which is used as a liner for the via and trenches. After the copper layer has been formed a second CMP step occurs to complete the conductors.

Figure 7:
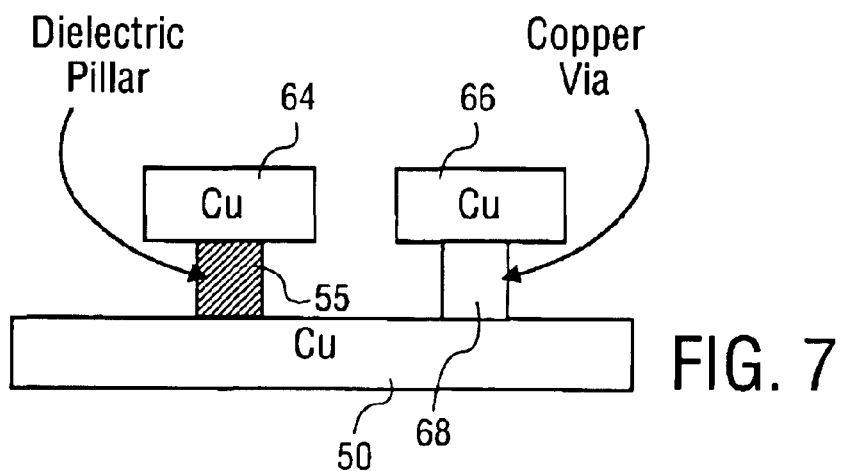
FIG. 7 illustrates the structure of FIG. 6 after additional processing and completion of the conductors.

In some embodiments, the dielectric layers 52 and 53 may be removed, as well as the etchant stop layer 51. This generally will not occur until all the levels have been formed with the solid or porous dielectric in place between the conductors. The resultant structure is shown in FIG. 7 without any solid dielectric between the conductors. It includes the conductor 50 at one level, and two conductors shown at the next level, specifically conductors 64 and 66. At the intersection of conductors 50 and 64, a dielectric pillar 55 is formed. At the intersection of the conductors 50 and 66, a copper via 68 is formed. Gas or vacuum is used for the dielectric for this embodiment.

For the processing described for FIGS. 3–7, an etchant stop is used between each of the levels. Where a gas or vacuum dielectric is used, as described above, the ILD-a, ILD-b and the etchant stop must be etched at each of the levels. Typically, it is difficult to find a single etchant that will etch the ILD slayers and the etchant stop layer. More typically, separate etching steps are needed to etch the ILD and the etchant stop layer. Where the ILD and etchant stop are present on each level, the etchant for these materials will need to be alternated for each level in order to remove all the dielectric material between the conductors in the interconnect structure. This may be inconvenient. Note, where the ILD-a and ILD-b are to remain in place, the above-described problem is not present and the etchant stop is no problem.

In FIGS. 8–15 a process is described which does not require the etchant stop layer. Thus, this process may be more suitable where a vacuum or air dielectric is used.

Figure 8:
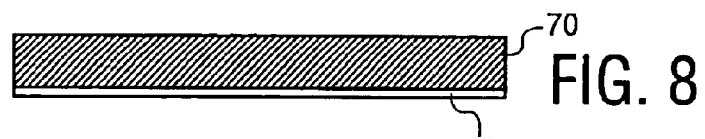
FIG. 8 is a cross-sectional elevation view illustrating a layer of a dielectric pillar material.
Figure 9:
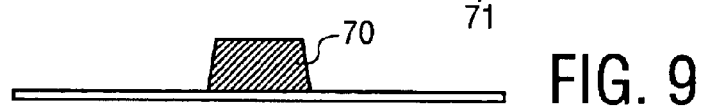
FIG. 9 illustrates the structure of FIG. 8 after an etching step.

Referring now to FIG. 8, a dielectric layer 70 having a thickness corresponding to the thickness of the dielectric pillars is formed on the layer 71. The material of layer 70, again, is a relatively hard material since it becomes the pillars and thus provides the mechanical support for the overlaying lines. (The layer 71 may be any starting layer, for instance, it may be conductors in an underlying level of conductors formed as shown in FIGS. 8–13.)

Ordinary masking and etching steps are used to define the dielectric pillars such as pillar 70.

Figure 10:
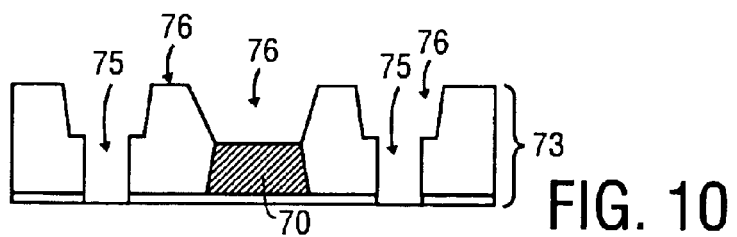
FIG. 10 illustrates the structure of FIG. 9 after an additional dielectric layer has been deposited and after additional etching.

Following the formation of the pillars as shown in FIG. 10, an ILD 73 is deposited and openings are etched both for the vias and for the conductors. For instance, in FIG. 10, via openings 75 are shown with trenches 76. Note that as was the case in the previous embodiments, a trench is formed above the pillar 70 since the pillar will support the conductor formed in this trench.

Figure 11:
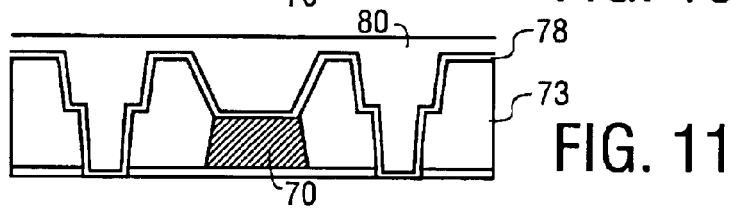
FIG. 11 illustrates the structure of FIG. 10 after the deposition of a barrier material and the electroplating of a copper layer.
Figure 12:
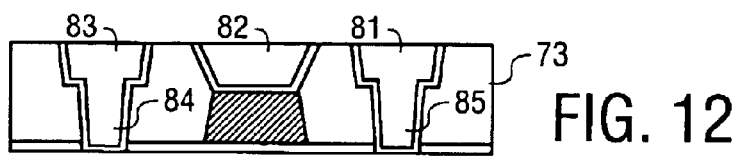
FIG. 12 illustrates the structure of FIG. 11 after a planarization step.
Figure 13:
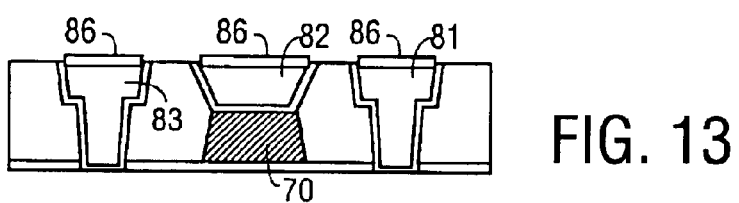
FIG. 13 illustrates the structure of FIG. 12 after shunts have been added.

Now as shown in FIG. 11, after the formation of a barrier layer 78, a copper or copper alloy layer 80 is electroplated onto the barrier material. Next, as shown in FIG. 12, planarization occurs such as the CMP previously discussed to define the conductors, as is typically the case in a damascene process.

Shunts are next formed above the conductors as shown by the conductive shunts 86. For instance, cobalt or nickel or an alloy thereof may be selectively deposited for the shunts. Such processing is described in co-pending application Ser. No. 09/753,256; Interconnect Structures and a Method of Electroless Introduction of Interconnect Structures, assigned to the assignee of the present application, filed Dec. 28, 2000. The shunts 86, as will be seen, protect the underlying conductors and provide an etchant stop for the next level of conductors.

Figure 14:
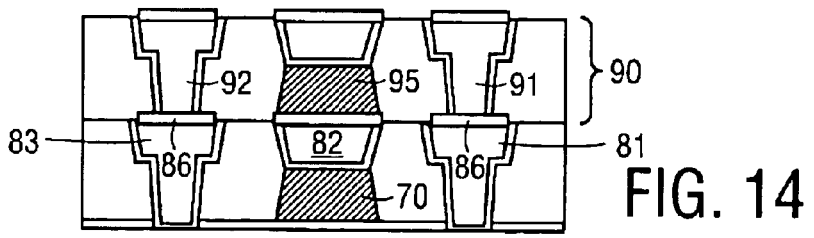
FIG. 14 illustrates the structure of FIG. 13 after an additional level of conductors have been formed.

Then as shown in FIG. 14, another level of pillars, conductors and vias may be formed. The steps described above in FIGS. 8–13 are repeated to form the pillars, vias and conductors for level 90. Note that at level 90 the orientation of the lines formed at this level are shown parallel to the underlying lines for purposes of illustration since this best shows the landing of the vias and pillars on the underlying shunts 86. These landings make it possible to avoid the use of an etchant stop layer. In practice, the conductors in level 90 run perpendicular to those in the underlying layer. (While in FIG. 14 pillar 95 is shown above pillar 70, it could also have been formed over the conductor 81 or 83 and a via formed where pillar 95 is shown.)

Figure 15:
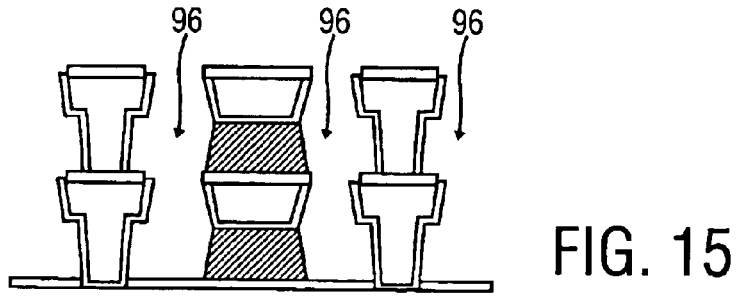
FIG. 15 illustrates the structure of FIG. 14 after the dielectric material between the conductors and pillars has been removed.

Finally, a single etching step may be used to remove all the dielectric material between the conductors. Thus, as shown in FIG. 15, the openings 96 may then be filled with air or contain a vacuum.

Thus, an interconnect structure has been described which uses a combination of vias and dielectric pillars to provide good mechanical support between the levels in the structure. This allows the use of a mechanically weak, low-k dielectric, air, or a vacuum between the conductors.

What is claimed is:

1. An interconnect structure for integrated circuit, comprising:

a first plurality of spaced-apart, parallel conductors disposed at a first level above a substrate;

a second plurality of spaced-apart, parallel conductors disposed at a second level above a substrate, the second conductors being disposed above the first conductors generally perpendicular to the first conductors, a projection of the second conductors on the first conductors defining a plurality of intersections;

a plurality of vias providing a conductive path between selected ones of the first and second conductors at some of the intersections;

a plurality of dielectric pillars formed entirely of dielectric extending between selected ones of the first and second conductors at other of the intersections for providing support for the second conductors from the first conductors;

wherein each of the intersections of first conductors and second conductors includes either one of the vias or one of the pillars.

2. The interconnect structure defined by claim 1, wherein the spaces between the first and second conductors are filled with a low-k dielectric.

3. The interconnect structure defined by claim 1, wherein the spaces between the first and second conductors are filled with a gas.

4. The interconnect structure defined by claim 1, wherein a vacuum is used between the first and second conductors.

5. The interconnect structure defined by claim 2, wherein the pillars are formed from a material harder than the low-k dielectric.

6. The interconnect structure defined by claim 1, wherein the pillars are formed from silicon dioxide.

7. An interconnect structure for a integrated circuit comprising:

a plurality of levels of conductors;

a plurality of vias extending between selected conductors on adjacent levels; and a plurality of dielectric pillars formed entirely of dielectric, separate and distinct from a second dielectric disposed between the conductors, the pillars extending between conductors in the adjacent levels at each intersection of the conductors in the adjacent levels where vias are not present.

8. The interconnect structure of claim 7, wherein the second dielectric is a low-k material and the pillars are of a harder material than the low-k material.

9. The interconnect structure of claim 7, wherein the dielectric is a gas or vacuum.

* * * * *

UNITED STATES PATENT AND TRADEMARK OFFICE
CERTIFICATE OF CORRECTION

PATENT NO.   : 6,919,637 B2
DATED        : July 19, 2005
INVENTOR(S)  : He et al.

It is certified that error appears in the above-identified patent and that said Letters Patent is hereby corrected as shown below:

Column 1,
Line 40, after "they", insert -- may --.

Signed and Sealed this

Twenty-seventh Day of September, 2005

JON W. DUDAS
*Director of the United States Patent and Trademark Office*